US009911665B2

United States Patent
Liu et al.

(10) Patent No.: US 9,911,665 B2
(45) Date of Patent: Mar. 6, 2018

(54) INTEGRATED CIRCUITS, METHODS OF FORMING THE SAME, AND METHODS OF DETERMINING GATE DIELECTRIC LAYER ELECTRICAL THICKNESS IN INTEGRATED CIRCUITS

(71) Applicant: GLOBALFOUNDRIES Singapore Pte. Ltd., Singapore (SG)

(72) Inventors: Wenhu Liu, Singapore (SG); Sung Mun Jung, Singapore (SG); Yi Tat Lim, Perak (MY); Ling Wu, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 278 days.

(21) Appl. No.: 14/586,466

(22) Filed: Dec. 30, 2014

(65) Prior Publication Data

US 2016/0190021 A1 Jun. 30, 2016

(51) Int. Cl.
| | | |
|---|---|---|
| *H01L 29/423* | (2006.01) | |
| *H01L 21/66* | (2006.01) | |
| *H01L 29/66* | (2006.01) | |
| *H01L 29/788* | (2006.01) | |

(52) U.S. Cl.
CPC .............. *H01L 22/14* (2013.01); *H01L 22/34* (2013.01); *H01L 29/66825* (2013.01); *H01L 29/7881* (2013.01)

(58) Field of Classification Search
CPC ................ H01L 22/14; H01L 29/7881; H01L 29/66825; H01L 22/34; H01L 27/11517; H01L 27/1156; H01L 29/42324; H01L 29/42328; H01L 27/0629; H01L 27/0635; H01L 27/067; H01L 27/0676; H01L 27/0722
See application file for complete search history.

(56) References Cited

U.S. PATENT DOCUMENTS

| | | | | |
|---|---|---|---|---|
| 8,896,087 | B2 * | 11/2014 | Terletzki | ............. H01L 27/0207 257/516 |
| 2002/0070402 | A1 * | 6/2002 | Ichige | ................. H01L 27/0805 257/296 |
| 2004/0014286 | A1 * | 1/2004 | Park | ................... H01L 21/28273 438/264 |

(Continued)

*Primary Examiner* — Bitew Dinke
(74) *Attorney, Agent, or Firm* — Lorenz & Kopf, LLP

(57) ABSTRACT

Integrated circuits, methods of forming integrated circuits, and methods of determining gate dielectric layer electrical thickness in integrated circuits are provided. An exemplary integrated circuit includes a semiconductor substrate including an active region and an STI structure disposed therein, adjacent to the active region. A first gate electrode structure overlies the active region and includes a first gate dielectric layer and a first gate electrode layer. A second gate electrode structure includes a second gate dielectric layer that overlies the first gate electrode layer and a second gate electrode layer that overlies the second gate dielectric layer. A source and drain region are formed in the active region, adjacent to the first gate electrode structure. First electrical interconnects are in electrical communication with the source and drain regions. A second electrical interconnect is in electrical communication with the first gate electrode layer.

18 Claims, 4 Drawing Sheets

(56) References Cited

U.S. PATENT DOCUMENTS

| | | | | |
|---|---|---|---|---|
| 2006/0138245 A1* | 6/2006 | Lee | ................ | G11C 11/005 235/492 |
| 2006/0240623 A1* | 10/2006 | Lee | ................ | B82Y 10/00 438/257 |
| 2007/0241386 A1* | 10/2007 | Wang | ................ | H01L 27/105 257/314 |
| 2009/0095995 A1* | 4/2009 | Kawashima | ................ | H01L 27/0629 257/296 |
| 2009/0098721 A1* | 4/2009 | Liu | ................ | H01L 27/11521 438/593 |
| 2009/0194805 A1* | 8/2009 | Kang | ................ | H01L 21/28273 257/321 |
| 2009/0316492 A1* | 12/2009 | Widjaja | ................ | G11C 11/404 365/189.2 |
| 2010/0052034 A1* | 3/2010 | Cheng | ................ | H01L 29/7881 257/316 |
| 2012/0034751 A1* | 2/2012 | Ariyoshi | ................ | H01L 21/823462 438/381 |
| 2013/0221422 A1* | 8/2013 | Noda | ................ | H01L 29/66825 257/316 |
| 2016/0276451 A1* | 9/2016 | Golanski | ................ | H01L 27/1207 |

* cited by examiner

INTEGRATED CIRCUITS, METHODS OF FORMING THE SAME, AND METHODS OF DETERMINING GATE DIELECTRIC LAYER ELECTRICAL THICKNESS IN INTEGRATED CIRCUITS

TECHNICAL FIELD

The technical field generally relates to integrated circuits, methods of forming integrated circuits, and methods of determining gate dielectric layer electrical thickness in integrated circuits. More particularly, the technical field relates to integrated circuits and methods of forming the integrated circuits with transistors that operate at modified input/output voltages, and methods of determining gate dielectric layer electrical thickness in integrated circuits.

BACKGROUND

The majority of present day integrated circuits (ICs) are implemented by using a plurality of interconnected field effect transistors (FETs), also called metal oxide semiconductor field effect transistors (MOSFETs or MOS transistors). A MOS transistor includes a gate electrode as a control electrode overlying a semiconductor substrate and spaced-apart source and drain regions in the substrate, between which a current can flow. A gate dielectric is disposed between the gate electrode and the semiconductor substrate to electrically isolate the gate electrode from the substrate. A control voltage applied to the gate electrode controls the flow of current through a channel in the substrate underlying the gate electrode between the source and drain regions.

The semiconductor industry is continuously moving toward the fabrication of smaller and more complex microelectronic components with higher performance. Memory cells are an important part of many microelectronic components, and smaller and more reliable memory cells are desirable. One type of memory cell uses flash memory that is non-volatile and re-writable. Non-volatile memory retains stored information even when the memory cell is de-powered, and stored information can be changed when a memory cell is re-writable. Some memory cells for flash memory store information by either charging or draining an electrically isolated component, such as a floating gate, and the information is recalled by determining if the isolated component is charged or not. Floating gate memory cells are typically provided with associated control gates and select gates that are utilized in the storage, retrieval, and erasing of memory on the floating gate.

Integrated circuits that include MOSFETs and flash memory cells are generally fabricated at facilities that include a series of discrete fabrication stages where specific operations are conducted to form various structures in the integrated circuits, including floating gate memory cells and associated control gates and select gates. After the facilities are constructed and the various fabrication stages are set up, modification of the fabrication stages is often difficult or impossible such that design changes for MOSFETs or flash memory cells cannot be implemented without retooling or addition of supplemental fabrication stages.

Fabrication of integrated circuits that include MOSFETs operating at various input/output (I/O) voltages is generally limited by the pre-existing fabrication stages at the fabrication facilities. For example, existing facilities that are set up to produce integrated circuits with 55 nm SST eFlash configurations are generally incapable of fabricating MOSFETs that operate at outside of original design I/O voltages for which the facilities were originally designed to fabricate, especially I/O voltages of greater than 3.3V. I/O voltages are generally dependent upon gate dielectric thickness, and facilities that are set up to produce integrated circuits with 55 nm SST eFlash configurations are generally not configured to produce MOSFETs with gate dielectric thicknesses sufficient to operate at I/O voltages in excess of 3.3V without adding supplemental fabrication stages to achieve sufficiently large gate dielectric thicknesses. However, it is to be appreciated that difficulties with fabricating MOSFETs that operate outside of original design I/O voltages (without adding supplemental fabrication stages) are not limited to 55 nm SST eFlash facilities.

Accordingly, it is desirable to provide integrated circuits and methods of forming integrated circuits including MOSFETs that operate at modified I/O voltages, especially higher I/O voltages than design I/O voltages for integrated circuits fabricated in the same fabrication stages, without adding supplemental fabrication stages. There is also a desire to develop methods for determining dielectric layer thickness in semiconductor devices. Furthermore, other desirable features and characteristics will become apparent from the subsequent detailed description and the appended claims, taken in conjunction with the accompanying drawings and this background.

BRIEF SUMMARY

Integrated circuits, methods of forming integrated circuits, and methods of determining gate dielectric layer electrical thickness in integrated circuits are provided herein. In an embodiment, an integrated circuit includes a semiconductor substrate including an active region and a shallow trench isolation structure disposed in the semiconductor substrate. The shallow trench isolation structure is disposed adjacent to the active region. A first gate electrode structure overlies the active region of the semiconductor substrate. The first gate electrode structure includes a first gate dielectric layer and a first gate electrode layer that overlies the first gate dielectric layer. A second gate electrode structure overlies the first gate electrode structure. The second gate electrode structure includes a second gate dielectric layer and a second gate electrode layer that overlies the second gate dielectric layer. A source region and a drain region are formed in the active region of the semiconductor substrate, adjacent to the first gate electrode structure. First electrical interconnects are in electrical communication with the source region and the drain region. A second electrical interconnect is in electrical communication with the first gate electrode layer of the first gate electrode structure.

In another embodiment, a method of forming an integrated circuit includes depositing a first gate dielectric material in a first location of an active region of a semiconductor substrate between shallow trench isolation structures. The first location of the active region is recessed below a top surface of the shallow trench isolation structures. A first gate electrode material is deposited over the first gate dielectric material. A second gate dielectric material is deposited over the first gate electrode material. A second gate electrode material is deposited over the second gate dielectric material. The second gate electrode material and the second gate dielectric material are patterned to form a second gate electrode structure that includes a second gate dielectric layer and a second gate electrode layer over the first gate electrode material. The first gate electrode material is patterned using the second gate electrode structure as a mask to form a first gate electrode structure that includes a first gate dielectric layer and a first gate electrode layer. A source region and a drain region are formed in the active region adjacent to the first gate electrode structure. Portions of the second gate electrode layer over a landing region of the first gate electrode layer are removed. The source region and the drain region are contacted with first electrical interconnects and the landing region of the first gate electrode layer is contacted with a second electrical interconnect.

In another embodiment, a method of determining dielectric layer electrical thickness in an integrated circuit includes providing an integrated circuit. The integrated circuit includes a semiconductor substrate including an active region and a shallow trench isolation structure disposed in the semiconductor substrate. The shallow trench isolation structure is disposed adjacent to the active region. A first gate electrode structure overlies the active region of the semiconductor substrate. The first gate electrode structure includes a first gate dielectric layer and a first gate electrode layer that overlies the first gate dielectric layer. A second gate electrode structure overlies the first gate electrode structure. The second gate electrode structure includes a second gate dielectric layer and a second gate electrode layer that overlies the second gate dielectric layer. A source region and a drain region are formed in the active region of the semiconductor substrate, adjacent to the first gate electrode structure. First electrical interconnects are in electrical communication with the source region and the drain region. A second electrical interconnect is in electrical communication with the first gate electrode layer of the first gate electrode structure. A third electrical interconnect is in electrical communication with the second gate electrode layer of the second gate electrode structure. The second electrical interconnect and the third electrical interconnect are connected to different nodes. The method further includes applying voltage to one of the first, second, or third electrical interconnects and measuring voltage drop between the first, second, and/or third electrical interconnects.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
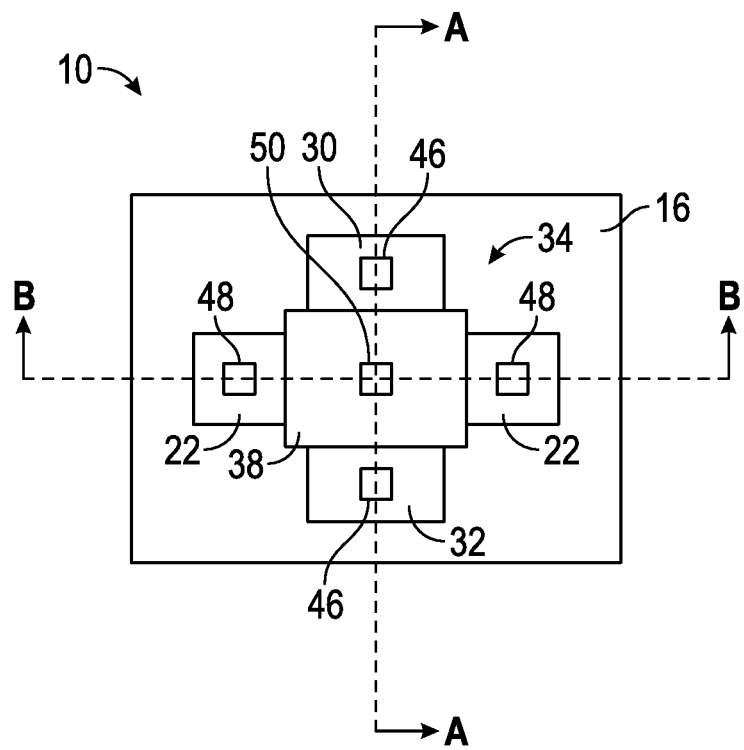
FIG. 1 is a schematic top view of portions of an integrated circuit in accordance with an embodiment.

The following detailed description is merely exemplary in nature and is not intended to limit the integrated circuits, methods of forming the integrated circuits, or methods of determining gate dielectric layer electrical thickness in integrated circuits. Furthermore, there is no intention to be bound by any theory presented in the preceding background or the following detailed description.

Embodiments of the present disclosure are generally directed to integrated circuits and methods for fabricating the same. For the sake of brevity, conventional techniques related to integrated circuit device fabrication may not be described in detail herein. Moreover, the various tasks and process steps described herein may be incorporated into a more comprehensive procedure or process having additional steps or functionality not described in detail herein. In particular, various steps in the manufacture of semiconductor-based transistors are well-known and so, in the interest of brevity, many conventional steps will only be mentioned briefly herein or will be omitted entirely without providing the well-known process details.

Integrated circuits, methods of forming integrated circuits, and methods of determining gate dielectric layer electrical thickness in integrated circuits are provided herein. The integrated circuits include a first gate electrode structure that is disposed over an active region of a semiconductor substrate, and a second gate electrode structure that is disposed over the first gate electrode structure. A source region and a drain region are formed in the active region of the semiconductor substrate, adjacent to the first gate electrode structure. First electrical interconnects are in electrical communication with the source region and the drain region, and a second electrical interconnect is in electrical communication with the first gate electrode layer of the first gate electrode structure. In conventional integrated circuit designs, the first gate electrode structure may be employed as a floating gate structure, which is useful in flash memory applications. However, in the integrated circuits and methods described herein with the second electrical interconnect electrically connected to the first gate electrode layer, the first gate electrode structure is effectively employed as a MOSFET within the integrated circuits. With thickness of the first gate dielectric layer determinative of I/O voltage associated with the MOSFET, MOSFETs having different I/O voltages may be formed in the same integrated circuit by forming both conventional MOSFETs and MOSFETs that include the first gate electrode structure as described herein. In embodiments, the first gate dielectric layer is thicker than conventional gate dielectric layers, with the first gate electrode structure formed during fabrication stages intended for formation of floating gate structures employed in flash memory devices. Thus, the thicker first gate dielectric layer may enable MOSFETs to be formed that operate at higher I/O voltages than design I/O voltages for conventional MOSFETs fabricated in the integrated circuits, without adding supplemental fabrication stages. Contacting the first gate electrode layer with the second electrical interconnect, as described herein, may also enable dielectric layer electrical thicknesses to be determined as described in further detail below.

An embodiment of an integrated circuit will now be described with reference to FIGS. 1-2B. The integrated circuit 10 includes a semiconductor substrate 12. As used herein, the term "semiconductor substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, 'semiconductor material' encompasses other materials such as relatively pure and impurity-doped germanium, gallium arsenide, zinc oxide, glass, and the like. An exemplary semiconductor material is a silicon substrate. The silicon substrate may be a bulk silicon wafer or may be a thin layer of silicon on an insulating layer (commonly known as silicon-on-insulator or SOI) that, in turn, is supported by a carrier wafer.

The semiconductor substrate 12 includes an active region 14 and a shallow trench isolation structure 16 disposed in the semiconductor substrate 12, adjacent to the active region 14. The active region 14 has a dopant concentration, or a concentration of conductivity determining ions, and the conductivity determining ions may be a P-type or N-type conductivity determining ions, depending upon whether a PMOS transistor or NMOS transistor is to be formed. Typical N-type conductivity determining ions include, but are not limited to, phosphorus, arsenic, antimony, and combinations thereof. Typical P-type conductivity determining ions include, but are not limited to, boron, aluminum, gallium, indium, and combinations thereof.

Figure 2A:
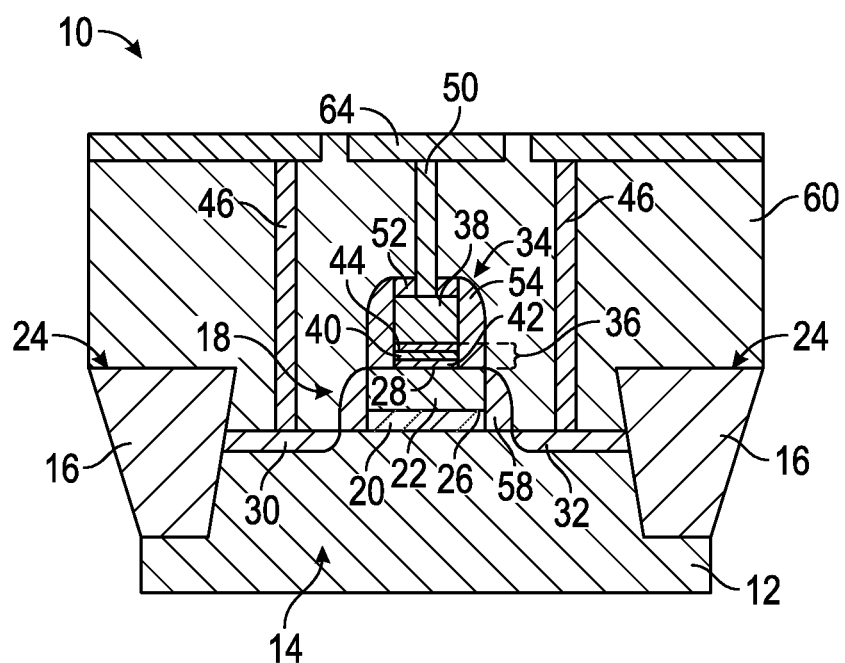
FIG. 2A is a cross-sectional schematic side view of portions of the integrated circuit of FIG. 1 along line A-A.
Figure 2B:
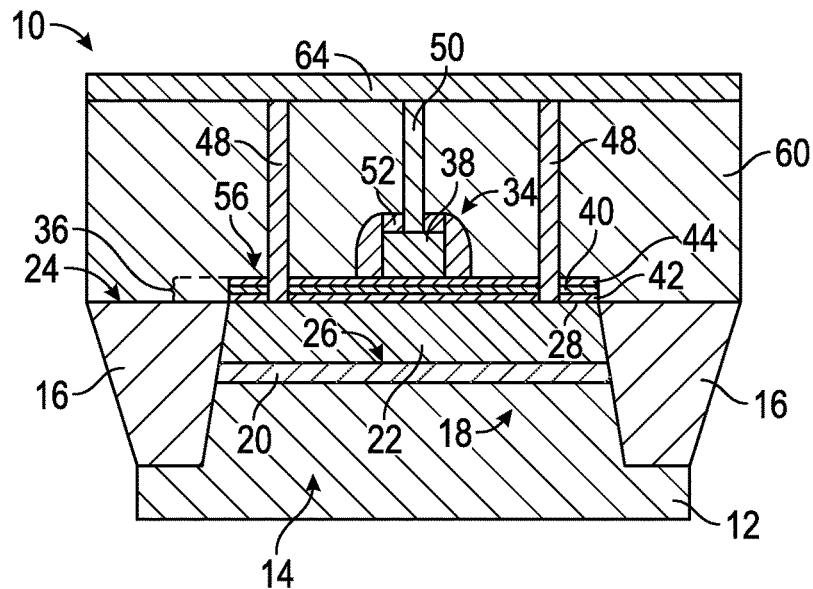
FIG. 2B is a cross-sectional schematic side view of portions of the integrated circuit of FIG. 1 along line B-B.

Referring to FIGS. 2A and 2B, a first gate electrode structure 18 is disposed over the active region 14 of the semiconductor substrate 12. The first gate electrode structure 18 includes a first gate dielectric layer 20 and a first gate electrode layer 22 overlying the first gate dielectric layer 20. As used herein, the term "overlying" is used to encompass both "over" and "on". In this regard, one feature that overlies a second feature may include intervening features, such as a layer, interposed between the one feature and the second feature within the scope of the term "overlying". Alternatively, the one feature may be formed directly on a surface of the second feature within the scope of the term "overlying". The aforementioned layers, as referred to herein, may each include one or more individual layers of different material that, together, perform the recited function. For example, the first gate dielectric layer 20 may include one or more individual layers that include different dielectric materials.

The first gate dielectric layer 20 is recessed below a top surface 24 of the shallow trench isolation structure 16, i.e., an upper surface 26 of the first gate dielectric layer 20 is recessed below the top surface 24 of the shallow trench isolation structure 16. In embodiments, the first gate dielectric layer 20 has a different thickness than other gate dielectric layers (not shown) in the integrated circuit 10 as a result of forming the first gate dielectric layer 20 at a different level within the integrated circuit 10 than other gate dielectric layers, thereby providing the different I/O voltage for MOSFETs formed using the first gate electrode structure 18 than I/O voltage for conventional MOSFETs formed in other regions of the integrated circuit 10. In embodiments, the first gate dielectric layer 20 has a thickness of from about 80 to about 140 Å, such as from about 100 to about 120 Å.

The first gate dielectric layer 20 may include an insulator material such as, but not limited to, silicon dioxide, silicon oxide, silicon nitride, or the like. In embodiments, the first gate dielectric layer 20 may include a high-K material. As referred to herein, "high-k material", or high dielectric constant material, is a material that has a dielectric constant that is greater than silicon (dielectric constant of 3.7). Examples of suitable high-k dielectric materials include, but are not limited to, hafnium oxide, lanthanum oxide, zirconium oxide, tungsten oxide, iridium oxide, aluminum oxide, and the like.

In embodiments and as shown in FIGS. 2A and 2B, a top surface 28 of the first gate electrode layer 22 is on substantially even plane with the top surface 24 of the shallow trench isolation structure 16. By "substantially even plane", it is meant that the surfaces are formed through techniques designed to result in the surfaces being on even plane, i.e., co-planar, with process error and unintended material loss through subsequent processing accounting for slight deviation. For example, subsequent wet clean techniques may unintentionally remove portions of the shallow trench isolation structure 16. As such, although the top surface 28 of the first gate electrode layer 22 is on substantially even plane with the top surface 24 of the shallow trench isolation structure 16, the top surface 24 of the shallow trench isolation structure 16 is generally at a slightly lower elevation than the top surface 28 of the first gate electrode layer 22. The first gate electrode layer 22 may include any electrically-conductive material that is conventionally employed in gate electrode structures. For example, the first gate electrode layer 22 may include polycrystalline silicon.

Referring again to FIGS. 2A and 2B, a source region 30 and a drain region 32 are formed in the active region 14 of the semiconductor substrate 12, adjacent to the first gate electrode structure 18. The source region 30 and the drain region 32 may be formed through self-aligned gate fabrication techniques, as described in further detail below.

A second gate electrode structure 34 overlies the first gate electrode structure 18. The second gate electrode structure 34 includes a second gate dielectric layer 36 and a second gate electrode layer 38, and the second gate electrode layer 38 overlies the second gate dielectric layer 36. A second gate cap layer 52 may overlie the second gate electrode layer 38 to mask the second gate electrode layer 38 during fabrication. The second gate electrode structure 34 and the first gate electrode structure 18 may include conventional features of a flash memory device, with the first gate electrode structure 18 having conventional features of a floating gate electrode structure and the second gate electrode structure 34 having features of a conventional control gate in the flash memory device. However, as described in further detail below, the first gate electrode structure 18 and the second gate electrode structure 34 do not function as a flash memory device due to an electrical connection established through an interconnect to the first gate electrode layer 22, which enables the first gate electrode structure 18 along with the source region 30 and the drain region 32 to function as a MOSFET.

In embodiments, the first gate electrode layer 22 is separated from the second gate electrode layer 38 only by the second gate dielectric layer 36, which is consistent with conventional configurations of flash memory devices with a floating gate electrode structure. The second gate dielectric layer 36 includes one or more individual layers of dielectric material and, when more than one layer of dielectric material is present, the dielectric materials may be the same or different. For example, in an embodiment and as shown in FIGS. 2A and 2B, the second gate dielectric layer 36 includes a nitride layer 40 disposed between two oxide layers 42, 44.

Referring to FIGS. 1 and 2A, first electrical interconnects 46 are in electrical communication with the source region 30 and the drain region 32 in accordance with conventional device configurations. Additionally, referring to FIGS. 1 and 2B, a second electrical interconnect 48 is in electrical communication with the first gate electrode layer 22 of the first gate electrode structure 18. In embodiments and as shown in FIGS. 1 and 2B, two second electrical interconnects 48 are in electrical communication with the first gate electrode layer 22, on opposite sides of the second gate electrode structure 34 from each other for purposes of evenly distributing electrical connections across the first gate electrode layer 22. It is to be appreciated that additional second electrical interconnects may also be present. Due to the positioning of the first gate electrode layer 22 in the integrated circuit 10, the second electrical interconnects 48 contact the first gate electrode layer 22 over the active region 14. With the second electrical interconnects 48 present, the first gate electrode layer 22 is no longer floated and, instead, functions as a gate electrode of a MOSFET but provides a different I/O voltage than other MOSFETs that may also be present in the integrated circuit 10 as explained above.

In embodiments and as shown in FIGS. 1-2B, a third electrical interconnect 50 is in electrical communication with the second gate electrode layer 38 of the second gate electrode structure 34. In this embodiment and as shown in FIG. 2B, the second electrical interconnects 48 and the third electrical interconnect 50 share a common electrical node 64. The third electrical interconnect 50 is present to avoid charge buildup in the second gate electrode layer 38, which may otherwise occur in the absence of the third electrical interconnect 50, but the third electrical interconnect 50 does not otherwise impact operation of the first gate electrode structure 18 as a gate electrode of the MOSFET.

An exemplary method of forming the integrated circuit 10 of FIGS. 1-2B will now be described with reference to FIGS. 3-5B. In accordance with the exemplary method and referring to FIG. 3, the semiconductor substrate 12 is provided and the shallow trench isolation structure 16 is formed in the semiconductor substrate 12 in accordance with conventional techniques, with the active region 14 adjacent to the shallow trench isolation structure 16 recessed below the top surface 24 of the shallow trench isolation structure 16. The active region 14 may be doped through appropriate doping techniques in accordance with conventional FEOL processing to form a well. A first gate dielectric material 120 is deposited in a first location of the active region 14 between shallow trench isolation structures 16, where the active region 14 has been recessed below the top surface 24 of the shallow trench isolation structure 16, and the deposited first gate dielectric material 120 eventually becomes the first gate dielectric layer after subsequent material removal operations. A first gate electrode material 122 is deposited over the first gate dielectric material 120, and eventually becomes the first gate electrode layer after subsequent material removal operations. In embodiments, the first gate electrode material 122 that overlies the first gate dielectric material 120 is planarized to form the top surface 28 of the first gate electrode material 122 on substantially even plane, i.e., co-planar, with the top surface 24 of the shallow trench isolation structure 16.

Figure 3:
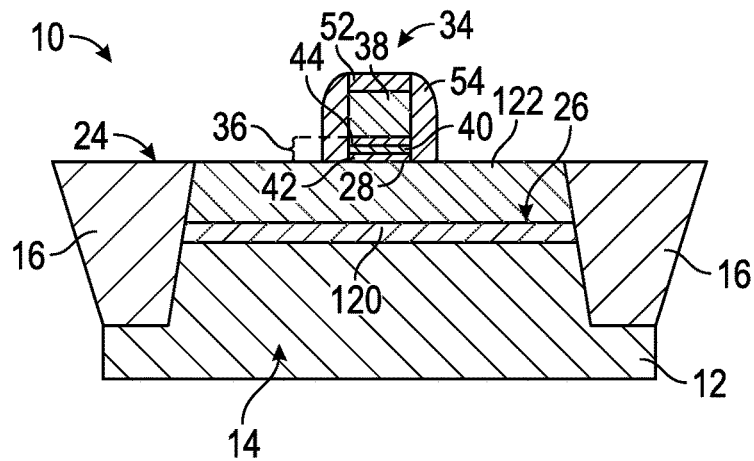
FIGS. 3-5B are cross-sectional side views of a method of forming an integrated circuit taken along lines A-A or B-B in accordance with an embodiment.

Referring again to FIG. 3, a second gate dielectric material is deposited over the first gate electrode material 122, a second gate electrode material is deposited over the second gate dielectric material, and a second gate cap material may be deposited over the second gate electrode material. The second gate cap material, the second gate electrode material, and the second gate dielectric material are patterned to form the second gate electrode structure 34 that includes the second gate cap layer 52, the second gate dielectric layer 36 and the second gate electrode layer 38 over the first gate electrode material 122. First sidewall spacers 54 may be formed adjacent to sidewalls of the second gate electrode structure 34 in anticipation of subsequent patterning of the first gate electrode material 122 using the second gate electrode structure 34 and the first sidewall spacers 54 as a mask for self-aligned formation of the first gate electrode structure. Although not shown, other devices may be formed in the integrated circuit 10 after formation of the second gate electrode structure 34 as shown in FIG. 3, and the second gate electrode structure 34 may be masked during formation of the other devices in the integrated circuit 10. For example and although not shown, wordline formation may be conducted with the second gate electrode structure 34 masked.

Figure 4A:
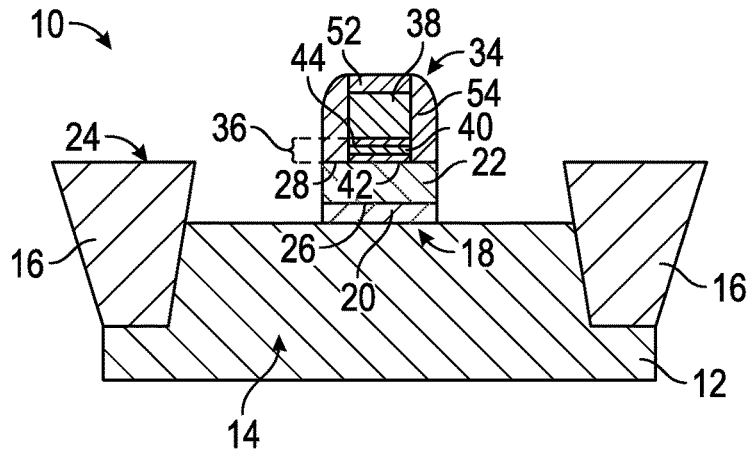
Figure 4B:
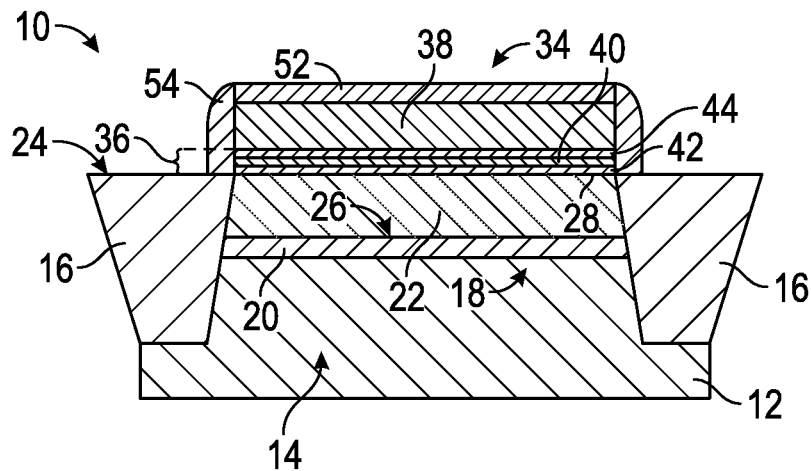

In an embodiment and referring to FIG. 4A, the first gate electrode material and the first gate dielectric material are patterned using the second gate electrode structure 34 as a mask to form the first gate electrode structure 18 that includes the first gate dielectric layer 20 and the first gate electrode layer 22. Patterning of the first gate electrode material and the first gate dielectric material may be conducted through conventional etching techniques using appropriate etchants for the type of material being etched. Patterning of the first gate electrode material and the first gate dielectric material as shown in FIG. 4A may be conducted in anticipation of forming the source region 30 and the drain region 32 adjacent to the resulting first gate electrode structure 18. However, referring to FIG. 4B, the second gate electrode structure 34 may mask other portions of the first gate electrode layer 22 that are to remain in place for providing a landing region for the second electrical interconnects, as described in further detail below. Although not shown, other devices may be formed in the integrated circuit 10 after patterning the first gate electrode material and the first gate dielectric material as shown in FIG. 4A, and the second gate electrode structure 34 and the first gate electrode structure 18. For example, semiconductor material may be blanket deposited over the second gate electrode structure 34 and the first gate electrode structure 18 and conventional gate electrode formation techniques may be conducted to form gate electrodes for conventional MOSFETs in other regions of the integrated circuit 10.

Figure 5A:
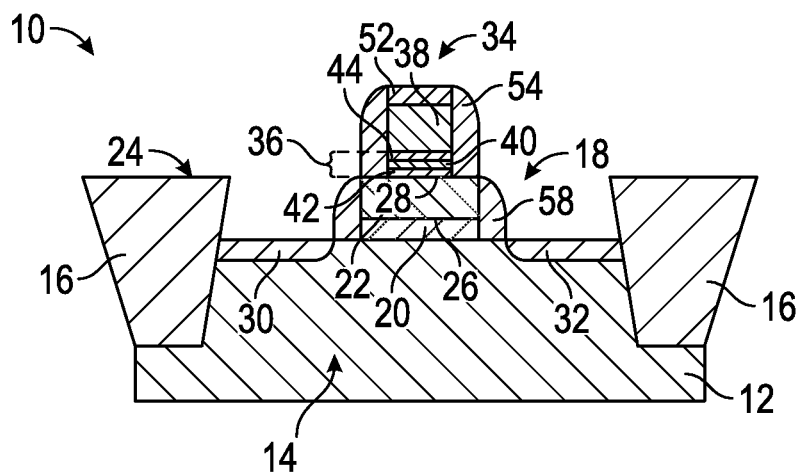
Figure 5B:
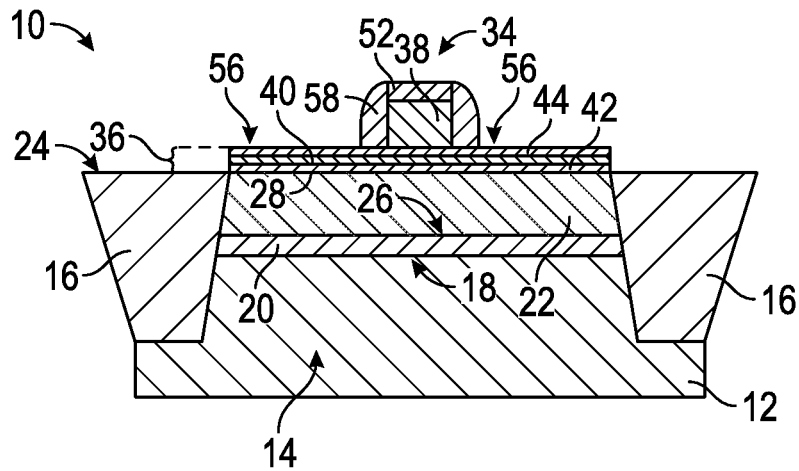

Referring to FIG. 5B, portions of the second gate electrode layer 38 are removed over a landing region 56 of the first gate electrode layer 22, and the portions of the second gate electrode layer 38 are removed at the same time as gate patterning of conventional MOSFETs formed in other regions of the integrated circuit 10. In this regard, removal of the portions of the second gate electrode layer 38 over the landing region 56 may be conducted without additional masking/etching stages beyond those in conventional process flows, and appropriate etchants can be used to remove the portions of the second gate electrode layer 38 over the landing region 56 while stopping on the second gate dielectric layer 36, thereby avoiding etching of the first gate electrode layer 22 that underlies the second gate dielectric layer 36. As shown in FIG. 5B, portions of the second gate dielectric layer 36 that overlie the first gate electrode layer 22 may remain in place to mask the first gate electrode layer 22 from exposure during formation of the source region and drain region for the first gate electrode structure 18, as described in further detail below. After removing the portions of the second gate electrode layer 38 over the landing region 56 of the first gate electrode layer 22, second sidewall spacers 58 are formed in anticipation of forming the source region and the drain region for the first gate electrode structure 18. As shown in FIGS. 5A and 5B, the second sidewall spacers 58 are formed adjacent to sidewalls of both the first gate electrode structure 18 and the second gate electrode structure 34. Referring to FIG. 5B, the second sidewall spacers 58 enable self-aligned formation of the source region 30 and the drain region 32 in the active region 14 adjacent to the first gate electrode structure 18. The source region 30 and the drain region 32 may be formed through conventional techniques.

After forming the source region 30 and the drain region 32, electrical interconnects are formed. In particular, referring to FIG. 2A, the source region 30 and the drain region 32 are contacted with the first electrical interconnects 46. Additionally, referring to FIG. 2B, the landing region 56 of the first gate electrode layer 22 is contacted with the second electrical interconnect 48 and the second gate electrode layer 38 is contacted with the third electrical interconnect 50. In embodiments, the first electrical interconnects 46, the second electrical interconnects 48, and the third electrical interconnect 50 are concurrently formed. For example, an interlayer dielectric layer 60 may be formed over the second gate electrode structure 34, followed by concurrent via etch and filling with electrically conductive material to form the respective interconnects 46, 48, 50. Because the interconnects 46, 48, 50 are concurrently formed, additional fabrication stages are unnecessary and any additional interconnects may be formed through modifications in pattern design during via formation in the interlayer dielectric layer 60.

Figure 6:
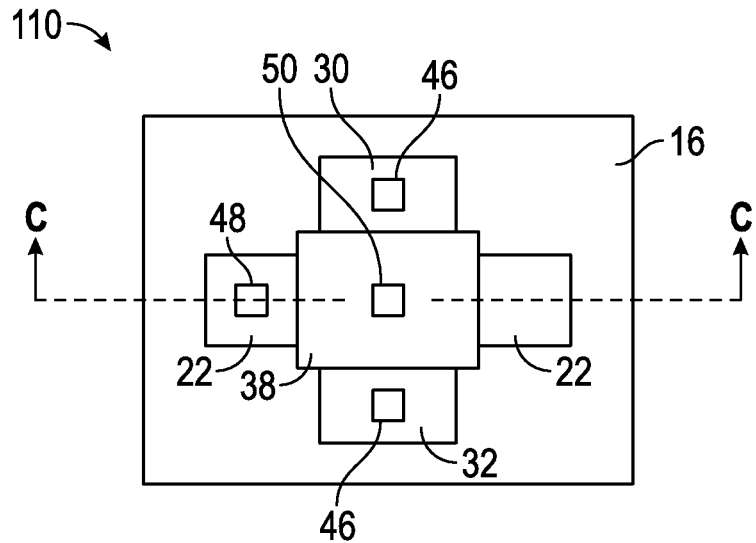
FIG. 6 is a schematic top view of portions of an integrated circuit in accordance with another embodiment.
Figure 7:
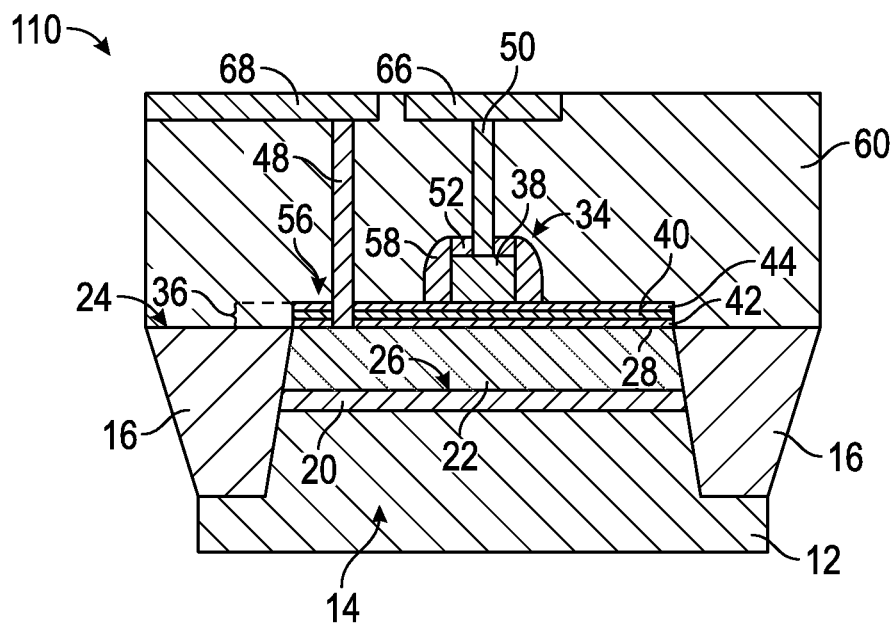
FIG. 7 is a cross-sectional schematic side view of portions of the integrated circuit of FIG. 6 along line C-C.

Another embodiment of an integrated circuit 110 will now be described with reference to FIGS. 6 and 7. In this embodiment, the integrated circuit 110 may be formed in the same manner as the integrated circuit 10 as described above and shown in FIGS. 1-5B. However, in this embodiment, the second electrical interconnect 48 and the third electrical interconnect 50 are connected to different nodes 66, 68. By connecting the second electrical interconnect 48 and the third electrical interconnect 50 to different nodes 66, 68, the first gate electrode layer 22 and the second gate electrode layer 38 are electrically isolated from each other and the resulting structure may be employed as a testing key for determining electrical thickness of the first gate dielectric layer 20 and/or the second gate dielectric layer 36. As referred to herein, "electrical thickness" means the equivalent oxide thickness, a number used to compare performance of high-k dielectric with performance of SiO2 dielectric. To determine electrical thickness, for example, voltage may be applied to one of the first electrical interconnects 46, the second electrical interconnect 48, or third electrical interconnect 50. Voltage drop between the respective interconnects 46, 48, 50 can then be measured, and the resulting measurement may be readily correlated to an electrical thickness of a dielectric layer of concern. For example, voltage may be applied to the second electrical interconnect 48 and a voltage drop between the second electrical interconnect 48 and the third electrical interconnect 50 may be measured, with such measurements enabling electrical thickness of the second gate dielectric layer 36 to be determined.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration in any way. Rather, the foregoing detailed description will provide those skilled in the art with a convenient road map for implementing an exemplary embodiment. It being understood that various changes may be made in the function and arrangement of elements described in an exemplary embodiment without departing from the scope as set forth in the appended claims.

What is claimed is:
1. An integrated circuit comprising:
a semiconductor substrate including an active region and shallow trench isolation structures disposed therein and adjacent to the active region with the active region disposed between and recessed below a top surface of the shallow trench isolation structures;
a first gate electrode structure overlying the active region of the semiconductor substrate, between the shallow trench isolation structures, wherein the first gate electrode structure comprises a first gate dielectric layer and a first gate electrode layer overlying the first gate dielectric layer and wherein the first gate dielectric layer is recessed below a top surface of the shallow trench isolation structures;
a second gate electrode structure overlying the first gate electrode structure, wherein the second gate electrode structure comprises a second gate dielectric layer and a second gate electrode layer overlying the second gate dielectric layer;
a source region and a drain region formed in the active region of the semiconductor substrate, adjacent to the first gate electrode structure;
first electrical interconnects in electrical communication with the source region and the drain region; and
a plurality of second electrical interconnects disposed on opposite sides of the second gate electrode layer and in electrical communication with the first gate electrode layer of the first gate electrode structure.

2. The integrated circuit of claim 1, wherein the first gate electrode layer is separated from the second gate electrode layer only by the second gate dielectric layer, and wherein the second gate dielectric layer comprises one or more individual layers of dielectric material.

3. The integrated circuit of claim 1, wherein the second gate dielectric layer comprises a nitride layer disposed between two oxide layers.

4. The integrated circuit of claim 1, wherein a top surface of the first gate electrode layer is on substantially even plane with the top surface of the shallow trench isolation structure.

5. The integrated circuit of claim 1, wherein the second electrical interconnect contacts the first gate electrode layer over the active region.

6. The integrated circuit of claim 1, wherein two second electrical interconnects are in electrical communication with the first gate electrode layer, on opposite sides of the second gate electrode structure from each other.

7. The integrated circuit of claim 1, further comprising a third electrical interconnect in electrical communication with the second gate electrode layer of the second gate electrode structure.

8. The integrated circuit of claim 7, wherein the second electrical interconnect and the third electrical interconnect share a common electrical node.

9. The integrated circuit of claim 7, wherein the second electrical interconnect and the third electrical interconnect are connected to different nodes.

10. The integrated circuit of claim 9, wherein the first gate electrode structure and the second gate electrode structure form a testing key for determining electrical thickness of the first gate dielectric layer and/or the second gate dielectric layer.

11. The integrated circuit of claim 1, wherein the first gate dielectric layer has a different thickness than other gate dielectric layers in the integrated circuit.

12. The integrated circuit of claim 1, wherein the first gate dielectric layer has a thickness of from about 80 to about 140 Å.

13. A method of forming an integrated circuit, wherein the method comprises:
depositing a first gate dielectric material in a first location of an active region of a semiconductor substrate between shallow trench isolation structures, wherein the first location of the active region is recessed below a top surface of the shallow trench isolation structures;

depositing a first gate electrode material over the first gate dielectric material, wherein a top surface of the first gate electrode material is coplanar with a top surface of the shallow trench isolation structures;

depositing a second gate dielectric material over the first gate electrode material;

depositing a second gate electrode material over the second gate dielectric material;

patterning the second gate electrode material and the second gate dielectric material to form a second gate electrode structure comprising a second gate dielectric layer and a second gate electrode layer over the first gate electrode material;

patterning the first gate electrode material using the second gate electrode structure as a mask to form a first gate electrode structure comprising a first gate dielectric layer and a first gate electrode layer;

forming a source region and a drain region in the active region adjacent to the first gate electrode structure;

removing portions of the second gate electrode layer over a landing region of the first gate electrode layer; and contacting the source region and the drain region with first electrical interconnects and the landing region of the first gate electrode layer with a plurality of second electrical interconnects, wherein the second electrical interconnects are disposed on opposite sides of the second gate electrode layer and in electrical communication with the first gate electrode layer of the first gate electrode structure.

14. The method of claim 13, wherein forming the source region and the drain region comprises removing portions of the first gate electrode layer exposed after patterning the second gate electrode structure.

15. The method of claim 13, wherein removing portions of the second gate electrode layer over the landing region comprises removing the portions of the second gate electrode layer that overlie the landing region of the first gate electrode layer after patterning the first gate electrode material and the first gate dielectric material using the second gate electrode structure as the mask to form the first gate electrode structure.

16. The method of claim 13, further comprising contacting the second gate electrode layer with a third electrical interconnect concurrent with contacting the source region and the drain region with the first electrical interconnects and the landing region of the first gate electrode layer with the second electrical interconnect.

17. The method of claim 16, wherein contacting the second gate electrode layer with the third electrical interconnect comprises contacting the second gate electrode layer with the third electrical interconnect that shares a common electrical node with the second electrical interconnect.

18. The method of claim 16, wherein contacting the second gate electrode layer with the third electrical interconnect comprises contacting the second gate electrode layer with the third electrical interconnect connected to a different node from the second electrical interconnect.

* * * * *